(12) United States Patent
Takagi

(10) Patent No.: US 9,929,693 B2
(45) Date of Patent: Mar. 27, 2018

(54) HIGH-FREQUENCY SEMICONDUCTOR AMPLIFIER

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 122 days.

(21) Appl. No.: 15/008,072

(22) Filed: Jan. 27, 2016

(65) Prior Publication Data
US 2016/0218677 A1    Jul. 28, 2016

(30) Foreign Application Priority Data

Jan. 27, 2015 (JP) .................................. 2015-013502

(51) Int. Cl.
*H03F 1/02* (2006.01)
*H03F 3/19* (2006.01)
(Continued)

(52) U.S. Cl.
CPC ........... *H03F 1/0205* (2013.01); *H01L 23/66* (2013.01); *H01P 5/028* (2013.01); *H03F 1/56* (2013.01);
(Continued)

(58) Field of Classification Search
CPC .................................................. H03F 1/0205
(Continued)

(56) References Cited

U.S. PATENT DOCUMENTS

| 5,352,990 A | 10/1994 | Goto |
| 5,473,281 A | 12/1995 | Honjo |

(Continued)

FOREIGN PATENT DOCUMENTS

| CN | 204119176 U | 1/2015 |
| EP | 2 637 302 A1 | 9/2013 |

(Continued)

OTHER PUBLICATIONS

Extended European Search Report dated Jun. 21, 2016 in European Patent Application No. 16152705.6.
(Continued)

*Primary Examiner* — Stephen E Jones
*Assistant Examiner* — Scott S Outten
(74) *Attorney, Agent, or Firm* — Oblon, McClelland, Maier & Neustadt, L.L.P.

(57) ABSTRACT

According to one embodiment, a high-frequency semiconductor amplifier includes an input terminal, an input matching circuit, a high-frequency semiconductor amplifying element, an output matching circuit and an output terminal. The input terminal is inputted with a fundamental signal. The fundamental signal has a first frequency band and a first center frequency in the first frequency band. The input matching circuit includes an input end and an output end. The input end of the input matching circuit is connected to the input terminal. The high-frequency semiconductor amplifying element includes an input end and an output end. The input end of the high-frequency semiconductor amplifying element is connected to the output end of the input matching circuit. The high-frequency semiconductor amplifying element is configured to amplify the fundamental signal.

10 Claims, 10 Drawing Sheets

(51) Int. Cl.
- *H03F 1/56* (2006.01)
- *H01L 23/66* (2006.01)
- *H03F 3/217* (2006.01)
- *H01P 5/02* (2006.01)
- *H03F 3/60* (2006.01)
- *H01P 1/24* (2006.01)
- *H01P 1/28* (2006.01)

(52) U.S. Cl.
CPC ............... *H03F 3/19* (2013.01); *H03F 3/217* (2013.01); *H01L 2223/6611* (2013.01); *H01L 2223/6633* (2013.01); *H01L 2223/6655* (2013.01); *H01L 2224/48091* (2013.01); *H01L 2924/0002* (2013.01); *H01P 1/24* (2013.01); *H01P 1/28* (2013.01); *H03F 3/60* (2013.01); *H03F 2200/451* (2013.01)

(58) Field of Classification Search
USPC .......................................................... 333/33
See application file for complete search history.

(56) References Cited

U.S. PATENT DOCUMENTS

| | | | |
|---|---|---|---|
| 6,396,348 B1 | 5/2002 | Honjo | |
| 7,183,873 B1 | 2/2007 | Schwendinger et al. | |
| 8,183,955 B2 * | 5/2012 | Dolmans | ................ H01P 5/028 |
| | | | 333/33 |
| 2008/0191801 A1 | 8/2008 | Kim et al. | |
| 2010/0079211 A1 | 4/2010 | Matsuda et al. | |
| 2013/0234794 A1 | 9/2013 | Takagi | |
| 2014/0218105 A1 | 8/2014 | Aoki et al. | |
| 2015/0381140 A1 * | 12/2015 | Embar | .................... H03F 3/217 |
| | | | 333/33 |

FOREIGN PATENT DOCUMENTS

| | | |
|---|---|---|
| JP | 6-204764 A | 7/1994 |
| JP | 2008-199625 A | 8/2008 |
| JP | 2009-207060 | 9/2009 |
| JP | 2010-154235 | 7/2010 |
| JP | 2013-187773 | 9/2013 |
| JP | 2013-187774 | 9/2013 |
| JP | 2013-187775 | 9/2013 |
| JP | 2014-150462 A | 8/2014 |
| JP | 2014-197872 A | 10/2014 |
| JP | 2015-149626 | 8/2015 |
| JP | 2015-149627 | 8/2015 |
| JP | 2016-197828 A | 11/2016 |

OTHER PUBLICATIONS

Office Action dated Nov. 8, 2016 in Japanese Patent Application No. 2015-013502 (with English language translation).
U.S. Appl. No. 14/801,227, filed Jul. 16, 2015, Kazutaka Takagi.
U.S. Appl. No. 14/817,583, filed Aug. 4, 2015, Kazutaka Takagi.

* cited by examiner

HIGH-FREQUENCY SEMICONDUCTOR AMPLIFIER

CROSS-REFERENCE TO RELATED APPLICATIONS

This application is based upon and claims the benefit of priority from the prior Japanese Patent Application No. 2015-013502, filed on Jan. 27, 2015; the entire contents of which are incorporated herein by reference.

FIELD

Embodiments described herein relate generally to a high-frequency semiconductor amplifier.

BACKGROUND

A high-frequency semiconductor amplifier operating in the high-frequency band of 1 GHz or more has recently been developed. Such a high-frequency semiconductor amplifier is used in e.g. radio communication equipment, mobile communication base stations, and radar devices. This high-frequency semiconductor amplifier is required to amplify and transmit signals in the high-frequency band at high power-added efficiency.

In a microwave semiconductor amplifying element, high efficiency operation called class-F mode can be achieved when the load impedance for the second harmonic seen from the output electrode end of the semiconductor amplifying element is made near-short, and the load impedance for the third harmonic is made near-open. In a known technique, an open-stub that is a tip-open transmission line of ⅛ wavelength of the fundamental is connected to the output electrode end of the semiconductor amplifying element so that the load impedance for the second harmonic seen from the output electrode end of the semiconductor amplifying element is made near-short. An open-stub that is a tip-open transmission line of 1/12 wavelength of the fundamental is connected to the output electrode end of the semiconductor amplifying element through a transmission line of ⅛ wavelength of the fundamental so that the load impedance for the third harmonic is made near-open.

Furthermore, in a microwave semiconductor amplifying element, high efficiency operation called inverse class-F mode can be achieved when the load impedance for the second harmonic seen from the output electrode end of the semiconductor amplifying element is made near-open, and the load impedance for the third harmonic is made near-short. In a known technique, the impedance for the second harmonic is controlled without affecting the fundamental by a harmonic impedance adjustment line so that the load impedance for the second harmonic is made near-open.

DETAILED DESCRIPTION

Figure 1A:
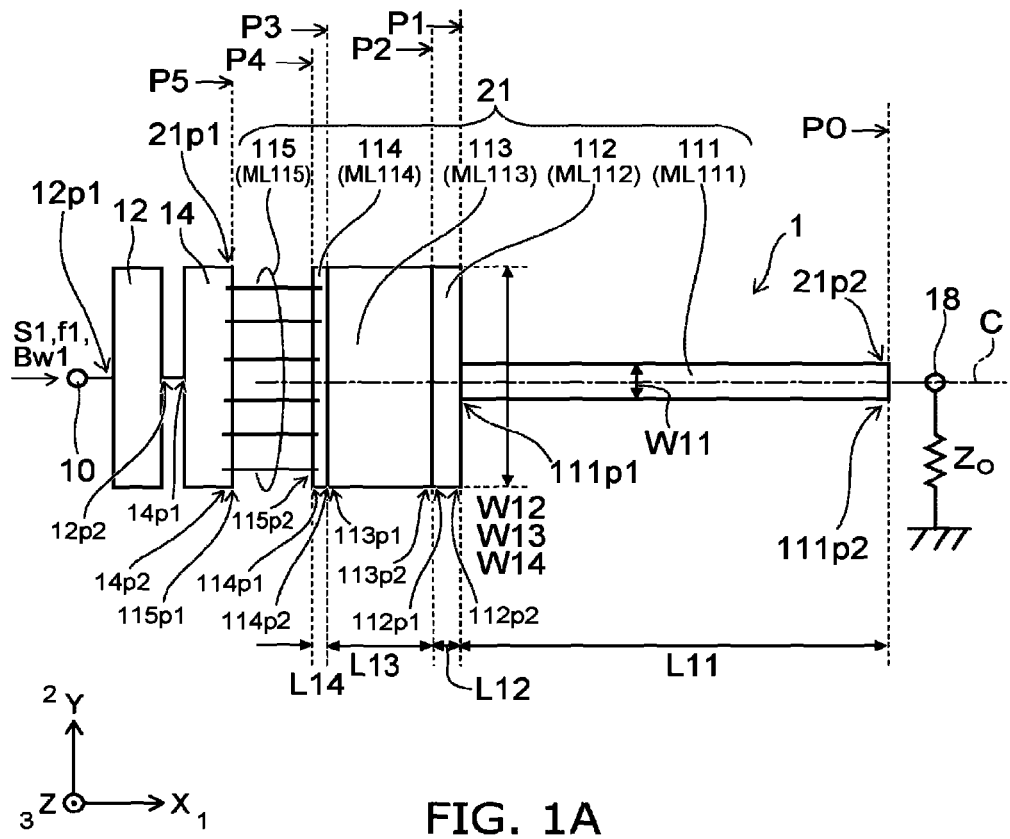
FIGS. 1A and 1B are schematic views showing a configuration of a high-frequency semiconductor amplifier according to a first embodiment.

According to one embodiment, a high-frequency semiconductor amplifier includes an input terminal, an input matching circuit, a high-frequency semiconductor amplifying element, an output matching circuit and an output terminal. The input terminal is inputted with a fundamental signal. The fundamental signal has a first frequency band and a first center frequency in the first frequency band. The input matching circuit includes an input end and an output end. The input end of the input matching circuit is connected to the input terminal. The high-frequency semiconductor amplifying element includes an input end and an output end. The input end of the high-frequency semiconductor amplifying element is connected to the output end of the input matching circuit. The high-frequency semiconductor amplifying element is configured to amplify the fundamental signal. The output matching circuit includes an input end and an output end. The input end of the output matching circuit is connected to the output end of the high-frequency semiconductor amplifying element. The output terminal is connected to the output end of the output matching circuit. The output matching circuit includes a first transmission line, a second transmission line, a third transmission line, a fourth transmission line and a wire part. The first transmission line includes an input end and an output end. The output end of the first transmission line is connected to the output end of the output matching circuit. The first transmission line has an electrical length of 72 degrees or more and 108 degrees or less at the first center frequency. A characteristic impedance of the first transmission line is lower than a load impedance of an external load connected in parallel to the output terminal. The load impedance of the external load is 50Ω. The second transmission line includes an input end and an output end. The output end of the second transmission line is connected to the input end of the first transmission line. The second transmission line has an electrical length of 18 degrees or more and 27 degrees or less at the first center frequency. A characteristic impedance of the second transmission line is lower than the characteristic impedance of the first transmission line. The third transmission line includes an input end and an output end. The output end of the third transmission line is connected to the input end of the second transmission line. The third transmission line has an electrical length of 18 degrees or more and 27 degrees or less at the first center frequency. A characteristic impedance of the third transmission line is lower than the characteristic impedance of the first transmission line. The characteristic impedance of the third transmission line is higher than resistance of a desired load impedance. The desired impedance is an impedance provided to the high-frequency semiconductor amplifying element for fundamental frequency. The line width along a second direction of the third transmission line is 0.8 times or more and 1.2 times or less of the line width along the second direction of the second transmission line. The fourth transmission line includes an input end and an output end. The output end of the fourth transmission line is connected to the input end of the third transmission line. The fourth transmission line has an electrical length of 5 degrees or more and 10 degrees or less at the first center frequency. A characteristic impedance of the fourth transmission line is equal to the resistance of the desired load impedance. The resistance of the desired load impedance is an impedance provided to the high-frequency semiconductor amplifying element for fundamental frequency. The wire part includes an input end and an output end. The output end of the wire part is connected to the input end of the fourth transmission line. The input end of the wire part is connected to the input end of the output matching circuit.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

First Embodiment

Figure 1B:
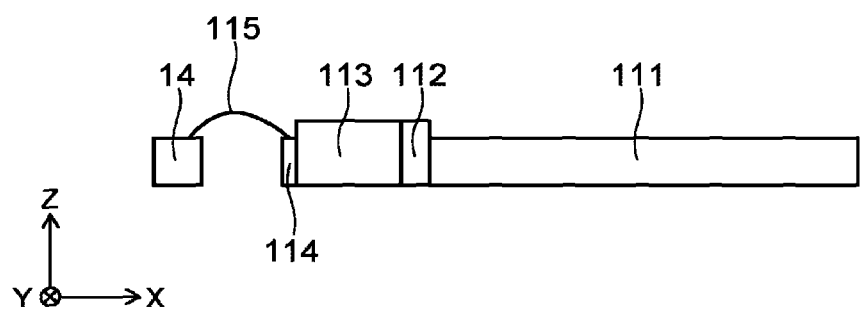

FIGS. 1A and 1B are schematic views showing the configuration of a high-frequency semiconductor amplifier according to this embodiment.

First, the configuration of the high-frequency semiconductor amplifier according to this embodiment is described.

As shown in FIGS. 1A and 1B, the high-frequency semiconductor amplifier 1 is composed of an input terminal 10 inputted a fundamental signal S1 including the first frequency band Bw1, an input matching circuit 12 connected to the input terminal 10, a high-frequency semiconductor amplifying element 14 connected to the input matching circuit 12, an output matching circuit 21 connected to the high-frequency semiconductor amplifying element 14, and an output terminal connected to the output matching circuit 21. A high-frequency fundamental signal S1 having a first frequency band Bw1 is inputted to the input terminal 10. The input end 12p1 of the input matching circuit 12 is connected to the input terminal 10. The input end 14p1 of the high-frequency semiconductor amplifying element 14 is connected to the output end 12p2 of the input matching circuit 12. The output end 14p2 of the high-frequency semiconductor amplifying element 14 is connected to the input end 21p1 of the output matching circuit 21. The output terminal 18 is connected to the output end 21p2 of the output matching circuit 21.

The input matching circuit 12 is a circuit for matching the power supply impedance with the input impedance of the high-frequency semiconductor amplifying element 14. The high-frequency semiconductor amplifying element 14 is an element for amplifying the high-frequency fundamental signal S1. An external load Zo is connected in parallel externally seen from the output terminal 18. The load impedance m0 of the external load Zo is e.g. 50Ω.

The DC circuit for supplying voltage to the high-frequency semiconductor amplifying element 14 is not shown.

The output matching circuit 21 is formed from a microstrip line 111 (ML111), a microstrip line 112 (ML112), a microstrip line 113 (ML113), a microstrip line 114 (ML114), and a wire part 115. The microstrip line is one example of a transmission line. The wire part 115 is formed from e.g. six wires. The output matching circuit 21 is a circuit for transforming a load impedance m0 of the external load Zo seen from the output terminal 18 to a desired load impedance md provided to the high-frequency semiconductor amplifying element 14. The desired load impedance and is determined by e.g. the load-pull measurement. The desired load impedance md is e.g. $(1+j1)\Omega$.

In the following, for convenience of description, an XYZ orthogonal coordinate system is adopted in this specification. More specifically, in FIGS. 1A and 1B, the extending direction of the microstrip line 111 is referred to as "X-direction". A direction orthogonal thereto is referred to as "Y-direction". The direction opposite to the "X-direction" is referred to as "−X-direction". The direction opposite to the "Y-direction" is referred to as "−Y-direction". The plane including the X-direction and the Y-direction is referred to as X-Y plane. The upward direction perpendicular to this X-Y plane is referred to as "Z-direction".

In this specification, the fundamental signal S1 has a first frequency band Bw1. The center frequency in the first frequency band Bw1 is referred to as first center frequency f1 or "fundamental frequency f1". The wavelength corresponding to the "fundamental frequency f1" is referred to as "fundamental wavelength $\lambda 1$". The frequency of twice the "fundamental frequency f1" is referred to as "second harmonic frequency f2". The wavelength corresponding to the "second harmonic frequency f2" is referred to as "second harmonic wavelength $\lambda 2$". The frequency of three times the "fundamental frequency f1" is referred to as "third harmonic frequency f3". The wavelength corresponding to the "third harmonic frequency f3" is referred to as "third harmonic wavelength $\lambda 3$".

The microstrip line 111, the microstrip line 112, the microstrip line 113, and the microstrip line 114 schematically show the pattern of microstrip lines.

The center line splitting the microstrip line 112 in the Y-direction, the center line splitting the microstrip line 113 in the Y-direction, and the center line splitting the microstrip line 114 in the Y-direction overlap the center line C splitting the microstrip line 111 in the Y-direction.

The reference plane P0 is a plane tangent to the X-direction end part of the microstrip line 111 and perpendicular to the X-direction. The reference plane P1 is a plane tangent to the X-direction end part of the microstrip line 112 and perpendicular to the X-direction. The reference plane P2 is a plane tangent to the X-direction end part of the microstrip line 113 and perpendicular to the X-direction. The reference plane P3 is a plane tangent to the X-direction end part of the microstrip line 114 and perpendicular to the X-direction. The reference plane P4 is a plane tangent to the −X-direction end part of the microstrip line 114 and perpendicular to the X-direction.

TABLE 1 is a table illustrating the electrical characteristics and dimensions of the microstrip lines in the high-frequency semiconductor amplifier 1 according to this embodiment.

TABLE 1

|  | ML111 | ML112 | ML113 | ML114 |
|---|---|---|---|---|
| Zc11~14(Ω) | 15.90 | 1.13 | 4.67 | 1.00 |
| EL11~14(°) | 96.0 | 26.0 | 24.0 | 7.0 |
| εr11~14 | 10 | 180 | 10 | 90 |
| t11~14(μm) | 150 | 220 | 220 | 140 |
| W11~14(mm) | 0.846 | 5.000 | 5.110 | 5.240 |
| L11~14(mm) | 9.310 | 0.560 | 2.190 | 0.210 |

The X-direction output end 111$p2$ of the microstrip line 111 (ML111) is connected to the output terminal 18 (the output end 21$p2$ of the output matching circuit 21) at the reference plane P0. The microstrip line 111 has a line width W11 of 0.846 mm along the Y-direction. The microstrip line 111 extends from the reference plane P0 by a line length L11 of 9.31 mm along the −X-direction. The input end 111$p1$ of the microstrip line 111 is connected to the output end 112$p2$ of the microstrip line 112 at the reference plane P1 to which the microstrip line 111 extends. The characteristic impedance Zc11 of the microstrip line 111 is 15.9Ω. The relative permittivity εr11 of the microstrip line 111 is 10. The substrate thickness t11 of the microstrip line 111 along the Z-direction is 150 μm. The characteristic impedance Zc11 is lower than the load impedance m0 of the external load Zo. At the fundamental frequency (first center frequency) f1, the electrical length EL11 of the microstrip line 111 is 96 degrees, being approximately ¼ times the fundamental wavelength λ1. The electrical length EL11 may be 72 degrees or more and 108 degrees or less at the fundamental frequency f1.

The microstrip line 112 (ML112) extends from the reference plane P1 by a line length L12 of 0.56 mm along the −X-direction with a line width W12 of 5.0 mm along the Y-direction. The input end 112$p1$ of the microstrip line 112 is connected to the output end 113$p2$ of the microstrip line 113 at the reference plane P2 to which the microstrip line 112 extends. The characteristic impedance Zc12 of the microstrip line 112 is 1.13Ω. The relative permittivity εr12 of the microstrip line 112 is 180. The substrate thickness t12 of the microstrip line 112 along the Z-direction is 220 μm. The relative permittivity εr12 of the microstrip line 112 is higher than the relative permittivity εr11 of the microstrip line 111. The characteristic impedance Zc12 of the microstrip line 112 is lower than the characteristic impedance Zc11. At the fundamental frequency f1, the electrical length EL12 of the microstrip line 112 is 26 degrees, being approximately 1/16 times the fundamental wavelength λ1. The electrical length EL12 may be 18 degrees or more and 27 degrees or less at the fundamental frequency f1.

The microstrip line 113 (ML113) extends from the reference plane P2 by a line length L13 of 2.19 mm along the −X-direction with a line width W13 of 5.11 mm along the Y-direction. The input end 113$p1$ of the microstrip line 113 is connected to the output end 114$p2$ of the microstrip line 114 at the reference plane P3 to which the microstrip line 113 extends. The line width W13 is 0.8 times or more and 1.2 times or less of the line width W12 of the microstrip line 112. The characteristic impedance Zc13 of the microstrip line 113 is 4.67Ω. The relative permittivity εr13 of the microstrip line 113 is 10. The substrate thickness t13 of the microstrip line 113 along the Z-direction is 220 μm. The relative permittivity εr12 of the microstrip line 112 is higher than the relative permittivity εr13 of the microstrip line 113. The characteristic impedance Zc13 is lower than the characteristic impedance Zc11. The characteristic impedance Zc13 is higher than the resistance R of the desired load impedance and provided to the high-frequency semiconductor amplifying element 14. At the fundamental frequency f1, the electrical length EL13 of the microstrip line 113 is 24 degrees, being approximately 1/16 times the fundamental wavelength λ1. The electrical length EL13 may be 8 degrees or more and 27 degrees or less at the fundamental frequency f1.

The microstrip line 114 (ML114) extends from the reference plane P3 by a line length L14 of 0.21 mm along the −X-direction with a line width W14 of 5.24 mm along the Y-direction. The input end 114$p1$ of the microstrip line 114 is connected to the output end 115$p2$ of the wire part 115 to which the microstrip line 114 extends. The characteristic impedance Zc14 of the microstrip line 114 is 1.00Ω. The relative permittivity εr14 of the microstrip line 114 is 90. The substrate thickness t14 of the microstrip line 114 along the Z-direction is 140 μm. The relative permittivity εr14 of the microstrip line 114 is higher than the relative permittivity εr11 of the microstrip line 111. The relative permittivity εr14 of the microstrip line 114 is higher than the relative permittivity εr13 of the microstrip line 113. The characteristic impedance Zc14 is nearly equal to the resistance R of the desired load impedance and provided to the high-frequency semiconductor amplifying element 14. The electrical length EL14 of the microstrip line 114 is 7 degrees, being approximately 1/50 times the fundamental wavelength λ1. The electrical length EL14 may be 5 degrees or more and 10 degrees or less at the fundamental frequency f1.

The wire part 115 is provided between the microstrip line 114 and the high-frequency semiconductor amplifying element 14. The wire part 115 connects the microstrip line 114 and the high-frequency semiconductor amplifying element 14. The wire part 115 is formed from e.g. six wires. The input end 115$p1$ of the wire part 115 is connected to the input end 21$p1$ of the output matching circuit 21.

The characteristic impedance Zc13 of the microstrip line 113 is higher than the characteristic impedance Zc12 of the microstrip line 112. The characteristic impedance Zc12 of the microstrip line 112 is higher than the characteristic impedance Zc14 of the microstrip line 114.

The relative permittivity εr12 of the microstrip line 112 is 1.6 times or more and 2.4 times or less of the relative permittivity εr14 of the microstrip line 114. The relative permittivity εr13 of the microstrip line 113 is 0.08 times or more and 0.12 times or less of the relative permittivity εr14 of the microstrip line 114.

The substrate thickness t12 along the Z-direction of the microstrip line 112 is 1.3 times or more and 1.9 times or less of the substrate thickness t14 along the Z-direction of the microstrip line 114.

The line width W12 along the Y-direction of the microstrip line 112 is 0.8 times or more and 1.2 times or less of the line width W14 along the Y-direction of the microstrip line 114. The line width W13 along the Y-direction of the microstrip line 113 is 0.8 times or more and 1.2 times or less of the line width W14 along the Y-direction of the microstrip line 114. The line width W13 along the Y-direction of the microstrip line 113 is longer than the line width W11 along the Y-direction of the microstrip line 111.

Next, the operation of the high-frequency semiconductor amplifier 1 according to this embodiment is described.

Figure 2:
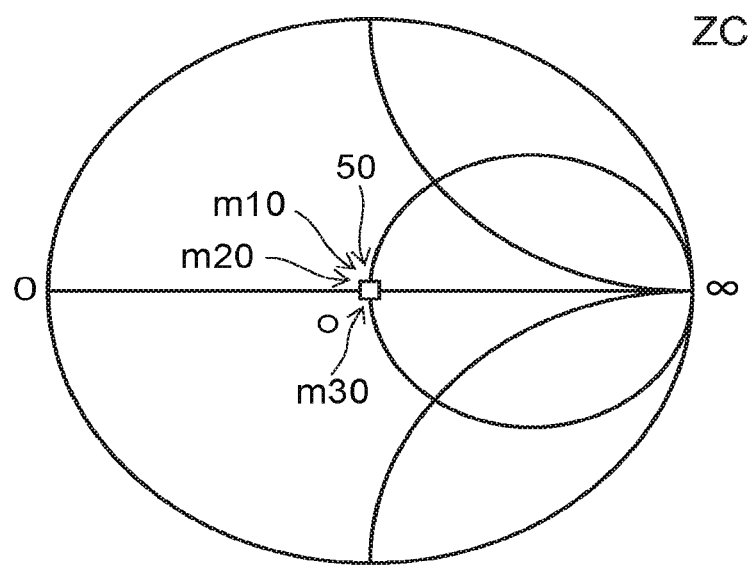
FIG. 2 is an impedance chart illustrating a load impedance seen from a reference plane P0 shown in FIG. 1A.

FIG. 2 is an impedance chart illustrating the load impedance seen from the reference plane P0 shown in FIG. 1A.

Figure 3A:
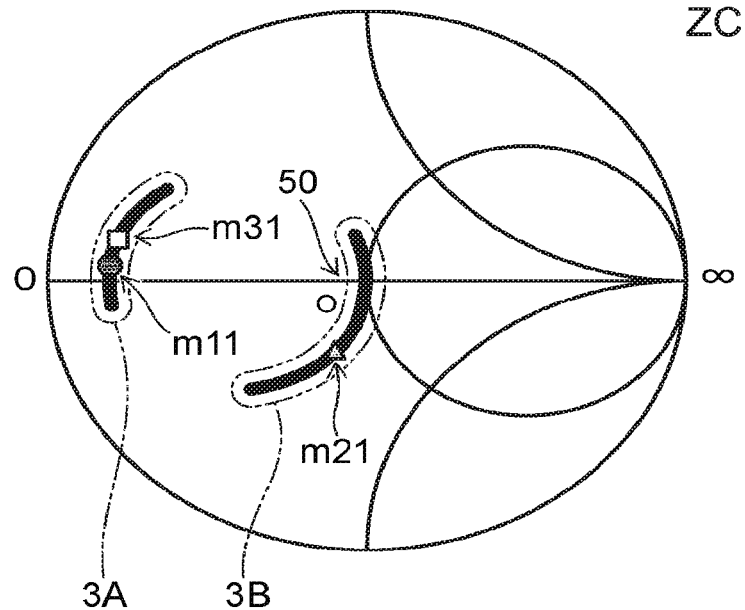
FIGS. 3A and 3B are impedance charts illustrating a load impedance seen from a reference plane P1 shown in FIG. 1A.
Figure 3B:
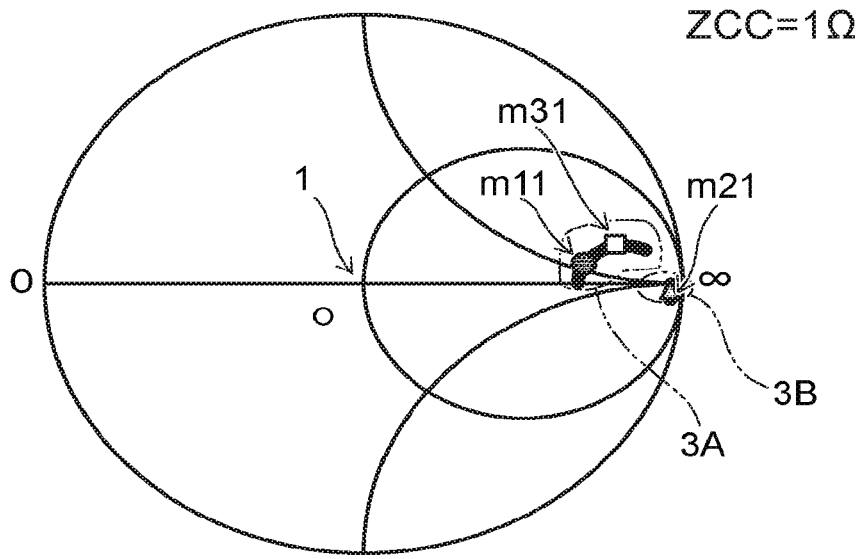

FIGS. 3A and 3B are impedance charts illustrating the load impedance seen from the reference plane P1 shown in FIG. 1A.

Figure 4:
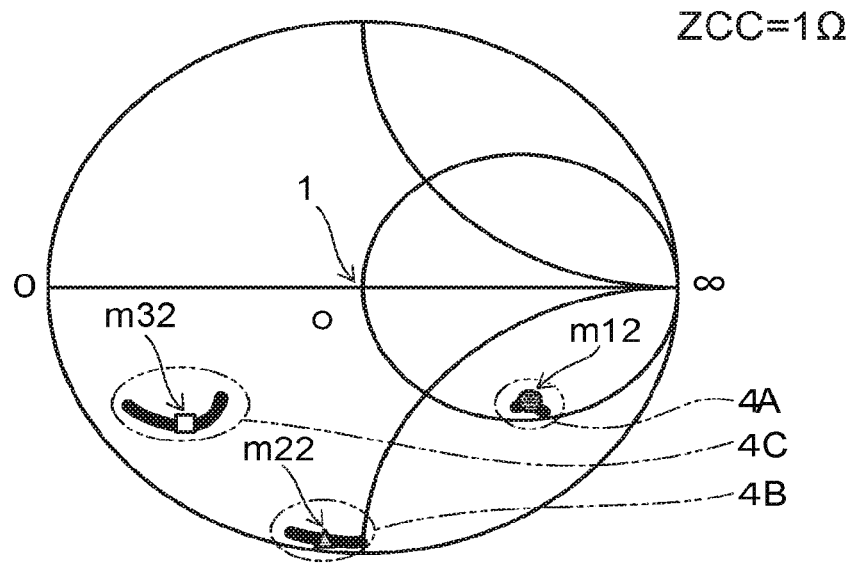
FIG. 4 is an impedance chart illustrating a load impedance seen from a reference plane P2 shown in FIG. 1A.

FIG. 4 is an impedance chart illustrating the load impedance seen from the reference plane P2 shown in FIG. 1A.

Figure 5:
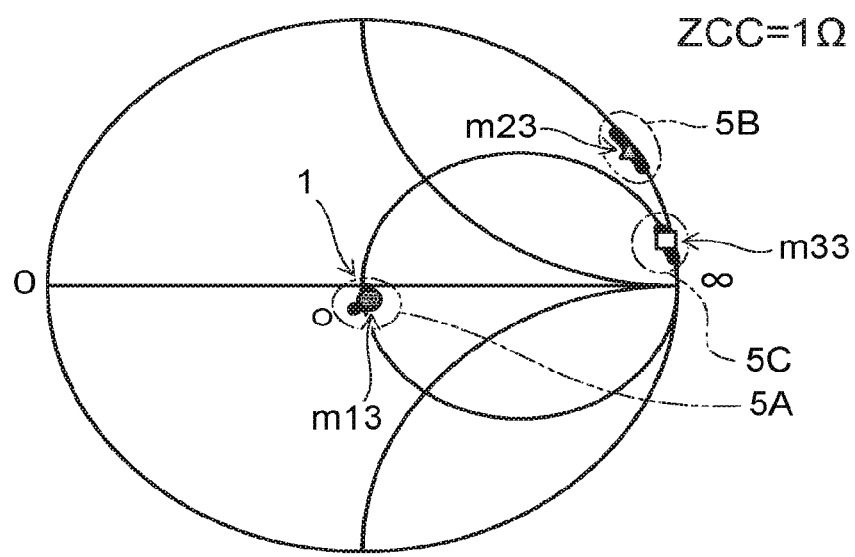
FIG. 5 is an impedance chart illustrating a load impedance seen from a reference plane P3 shown in FIG. 1A.

FIG. 5 is an impedance chart illustrating the load impedance seen from the reference plane P3 shown in FIG. 1A.

Figure 6:
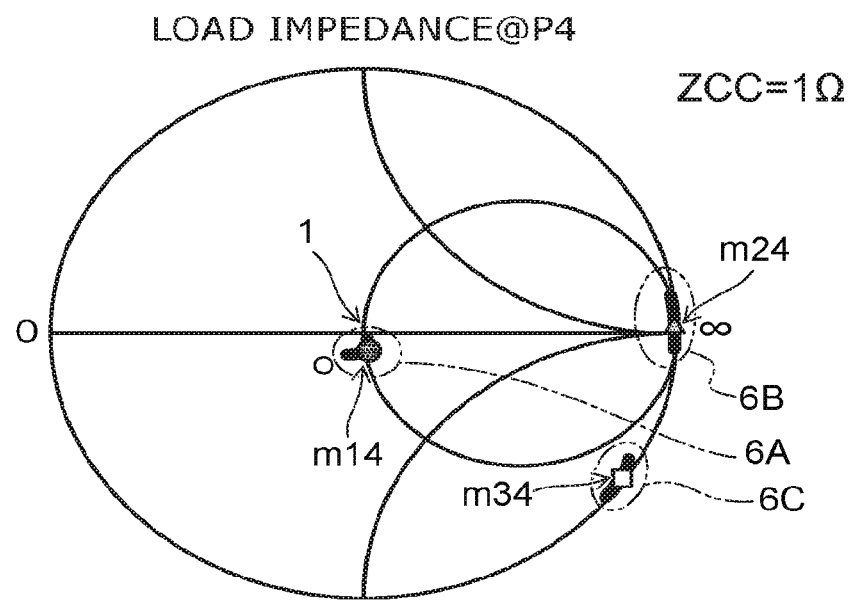
FIG. 6 is an impedance chart illustrating a load impedance as viewed from a reference plane P4 shown in FIG. 1A.

FIG. 6 is an impedance chart illustrating the load impedance seen from the reference plane P4 shown in FIG. 1A.

Figure 7:
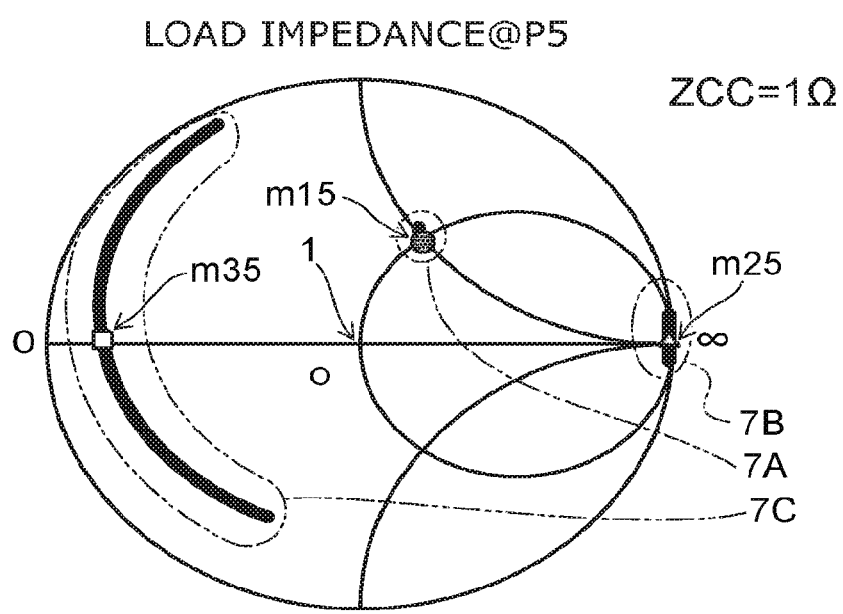
FIG. 7 is an impedance chart illustrating a load impedance seen from a reference plane P5 shown in FIG. 1A.

FIG. 7 is an impedance chart illustrating the load impedance seen from the reference plane P5 shown in FIG. 1A.

The impedance chart of FIG. 2 is normalized so that the center point O represents 50Ω (characteristic impedance ZCC=50Ω).

The impedance chart of FIG. 3A is normalized so that the center point O represents 50Ω (ZCC=50Ω). The impedance chart of FIG. 3B is normalized so that the center point O represents 1Ω (ZCC=1Ω).

The impedance charts of FIGS. 4 to 7 are normalized so that the center point O represents 1Ω (ZCC=1Ω).

In FIGS. 3A to 7, the symbols m11-m15 represent the load impedance at the fundamental frequency f1. The symbols m21-m25 represent the load impedance at the second harmonic frequency f2. The symbols m31-m35 represent the load impedance at the third harmonic frequency f3.

This example shows the case where the load impedance m15 at the fundamental frequency f1 seen from the reference plane P5 is transformed to approximately (1+j1)Ω.

As shown in FIG. 2, the side of the output terminal 18 connected with the external load Zo is seen from the reference plane P0. Then, the load impedance m10 at the fundamental frequency f1, the load impedance m20 at the second harmonic frequency f2, and the load impedance m30 at the third harmonic frequency f3 are located at the center point O near 50Ω.

The load impedance at the fundamental, second harmonic, and third harmonic frequencies can be determined by measurement and simulation, and indicated on the impedance chart.

As shown in TABLE 1, the electrical length of the microstrip line 111 at the fundamental frequency f1 is 96 degrees. The electrical length of 96 degrees corresponds to approximately a quarter wavelength. Thus, the microstrip line 111 operates like a quarter wavelength transformer.

The characteristic impedance Zc11 of the microstrip line 111 is lower than 50Ω, which is the load impedance m0 of the external load Zo. Thus, as shown in FIGS. 3A and 3B, the load impedance m11 at the fundamental frequency f1 seen from the reference plane P1 is transformed to an impedance lower than 50Ω, which is the load impedance m0 of the external load Zo. The load impedance in the first frequency band Bw1 is also transformed to a neighborhood portion including the load impedance m11. This portion is indicated as portion 3A in FIGS. 3A and 3B.

The electrical length EL11 of the microstrip line 111 is approximately a three-quarter wavelength at the third harmonic frequency f3. Thus, the load impedance m31 at the third harmonic frequency f3 is transformed to the portion 3A. The signal having a frequency of three times that of the fundamental signal S1 is referred to as third harmonic signal S3. The load impedance for the third harmonic signal S3 having a frequency band is also transformed to the portion 3A having a low impedance.

The electrical length EL11 of the microstrip line 111 is approximately a two-quarter wavelength at the second harmonic frequency f2. Thus, the load impedance m21 at the second harmonic frequency f2 remains near 50Ω without substantial change. This portion near 50Ω is indicated as portion 3B in FIGS. 3A and 3B. At this stage, only the load impedance m21 for the second harmonic is separated from the load impedance m11 for the fundamental and the load impedance m31 for the third harmonic.

The characteristic impedance Zc12 of the microstrip line 112 is lower than the characteristic impedance Zc11 of the microstrip line 111. The electrical length EL12 at the fundamental frequency f1 is as short as 26 degrees. Thus, as shown in FIG. 4, the load impedance m12 at the fundamental frequency f1 seen from the reference plane P2 is transformed to a portion 4A on the resistance of R=1Ω. The resistance of R=1Ω is the same value as the resistance component of the desired load impedance and provided to the high-frequency semiconductor amplifying element 14. The load impedance m22 at the second harmonic frequency f2 is transformed to a portion 4B different from the portion 4A. The electrical length at the fundamental frequency f1 is as short as approximately 26 degrees. Thus, the electrical length EL12 is less than or equal to a three-quarter wavelength also at the third harmonic frequency f3. Accordingly, the load impedance m32 at the third harmonic frequency f3 is transformed to a portion 4C different from the portion 4A and the portion 4B. That is, the load impedances m12, m22, and m32 at the fundamental, the second harmonic, and the third harmonic are separated.

The characteristic impedance Zc13 of the microstrip line 113 is higher than that of the microstrip line 112. The electrical length EL13 at the fundamental frequency f1 is approximately 24 degrees. The microstrip line 113 is added to the microstrip line 112. Thus, as shown in FIG. 5, the load impedance m13 at the fundamental frequency f1 seen from the reference plane P3 is transformed to a portion 5A near 1Ω. The load impedance m23 at the second harmonic frequency f2 is transformed to a portion 5B. The portion 5B is an inductive region near ∞Ω. The load impedance m33 at the third harmonic frequency f3 is transformed to a portion 5C. The portion 5C is inductive near ∞Ω and different from the portion 5B.

In the impedance chart of FIG. 5, an inductive impedance is indicated in the upper half region of the impedance chart. A capacitive impedance is indicated in the lower half region of the impedance chart.

The characteristic impedance Zc14 of the microstrip line 114 is close to the load impedance m13 at the fundamental frequency f1 seen from the reference plane P3. The microstrip line 114 is added to the microstrip line 113. Thus, as shown in FIG. 6, the load impedance m14 at the fundamental frequency f1 seen from the reference plane P4 remains near 1Ω without substantial change. This portion near 1Ω is indicated as portion 6A in FIG. 6. The load impedance m24 at the second harmonic frequency f2 is transformed to a portion 6B. The portion 6B is an inductive region near ∞Ω. The load impedance m34 at the third harmonic frequency f3 is transformed to a portion 6C. The portion 6C is a capacitive region. At this stage, the load impedance m34 for the third harmonic is capacitive.

The wire part 115 is added to the microstrip line 114. Thus, as shown in FIG. 7, the load impedance m15 at the fundamental frequency f1 seen from the reference plane P5 is transformed to a portion 7A near $(1+j1)\Omega$ because of the added inductivity of the wire part 115. The load impedance m25 at the second harmonic frequency f2 remains near $\infty\Omega$. This portion near $\infty\Omega$ is indicated as portion 7B in FIG. 7. The load impedance m35 at the third harmonic frequency f3 is transformed to a portion 7C near $0\Omega$ due to resonance between the capacitivity in the aforementioned portion 6C and the inductivity of the wire part 115.

The amount of capacitivity produced by the addition of the microstrip line 114 may be smaller than the amount of inductivity of the wire part 115. In this case, the load impedance m35 at the third harmonic frequency f3 is not transformed to approximately $0\Omega$ due to insufficient resonance between capacitivity and inductivity. The amount of capacitivity produced by the addition of the microstrip line 114 may be larger than the amount of inductivity of the wire part 115. Also in this case, the load impedance m35 at the third harmonic frequency f3 is not transformed to approximately $0\Omega$ due to insufficient resonance between capacitivity and inductivity.

Thus, the electrical length EL14 of the microstrip line 114 needs to be selected so as to achieve resonance between the capacitivity produced by the addition of the microstrip line 114 and the inductivity of the wire part 115.

The high-frequency semiconductor amplifier 1 according to this embodiment has been described with reference to the example in which the load impedance at the fundamental frequency f1 seen from the reference plane P5 is transformed to approximately $(1+j1)\Omega$. However, this embodiment is not limited thereto. The load impedance may be transformed to a different desired load impedance.

Next, the effect of the high-frequency semiconductor amplifier 1 according to this embodiment is described.

High power-added efficiency is achieved in the high-frequency semiconductor amplifier by an output matching circuit connected to the output of the high-frequency semiconductor amplifying element. Thus, the load impedance at the fundamental frequency is matched with a desired impedance. The load impedance at even harmonics such as the second harmonic frequency is set to $\infty\Omega$. The load impedance at odd harmonics such as the third harmonic frequency is set to $0\Omega$. Such operation of the high-frequency semiconductor amplifier is referred to as inverse class-F operation. The inverse class-F operation of the high-frequency semiconductor amplifier eliminates the even harmonics of voltage and the odd harmonics of current. The voltage and the current both exist only at the fundamental frequency. This realizes high power-added efficiency.

In the high-frequency semiconductor amplifier 1 according to this embodiment, by the microstrip line 112, the load impedance m12 at the fundamental frequency f1 is transformed to the portion 4A shown in FIG. 4. The load impedance m22 at the second harmonic frequency f2 is transformed to the portion 4B shown in FIG. 4. The load impedance m32 at the third harmonic frequency f3 is transformed to the portion 4C shown in FIG. 4. The portions 4A, 4B, and 4C are separate. Thus, the load impedance m15 at the fundamental frequency f1 seen from the reference plane P5 is easily transformed to the final target of approximately $(1+j1)\ \Omega$. The load impedance m25 at the second harmonic frequency f2 is easily transformed to the final target of approximately $\infty\Omega$. The load impedance m35 at the third harmonic frequency f3 is easily transformed to the final target of approximately $0\Omega$.

By the microstrip line 114, the load impedance m14 at the fundamental frequency f1 remains near $1\Omega$. However, the load impedance m24 at the second harmonic frequency f2 is transformed to approximately $\infty\Omega$. The load impedance m34 at the third harmonic frequency f3 is transformed to a capacitive region.

By the wire part 115, the load impedance m15 at the fundamental frequency f1 is transformed to approximately $(1+j1)\Omega$. The load impedance m25 at the second harmonic frequency f2 is transformed to approximately $\infty\Omega$. The load impedance m35 at the third harmonic frequency f3 is resonated with the inductivity of the wire part 115 and transformed to approximately $0\Omega$. As a result, high power-added efficiency can be achieved by the inverse class-F operation of the high-frequency semiconductor amplifier 1. The power-added efficiency can be improved by approximately 5-10%.

Figure 8:
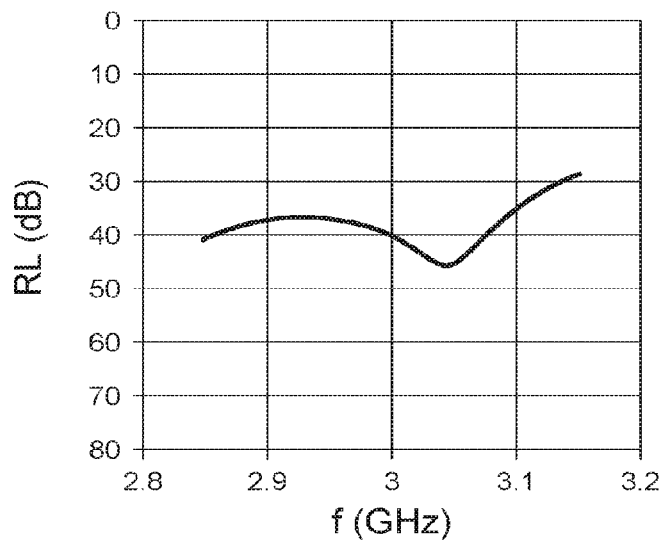
FIG. 8 is a graph illustrating a return loss RL seen from the reference plane P5 shown in FIGS. 1A and 1B.

FIG. 8 is a graph illustrating the return loss RL seen from the reference plane P5 shown in FIGS. 1A and 1B. In FIG. 8, the horizontal axis represents frequency f (GHz). The vertical axis represents the return loss RL (dB) for the load impedance m15 provided to the high-frequency semiconductor amplifying element 14. The load impedance m15 is e.g. $(1+j1)\Omega$.

As shown in FIG. 8, the return loss RL at the fundamental frequency f1 can be set to 30 dB or more at frequency f of approximately 2.7-3.1 GHz.

A high-frequency semiconductor amplifier for performing only the transformation of the load impedance for the fundamental uses a plurality of impedance transformation lines to lower a high impedance to the load impedance provided to the high-frequency semiconductor amplifying element 14. Thus, the characteristic impedance of the line is made sequentially lower with the decrease of the transformed impedance. As a result, the line width is also made sequentially wider. However, the high-frequency semiconductor amplifier 1 of this invention controls the load impedance for the second and third harmonics. Thus, the characteristic impedance Zc13 of the microstrip line 113 needs to be higher than the characteristic impedance Zc12 of the microstrip line 112 and the characteristic impedance Zc14 of the microstrip line 114. Accordingly, as in TABLE 4 shown in the third comparative example described later, if the microstrip line 412, the microstrip line 413, and the microstrip line 414 are formed on a substrate having the same permittivity and the same thickness, then the line width is not made sequentially wider, but a depression occurs as shown in FIG. 16. Thus, while the substrate thickness and the relative permittivity of the substrate of the microstrip line 113 are selected from among commercially available ones, the substrate thickness is optimized. Accordingly, the line width W13 can be made comparable to the line width W12 and the line width W14. As a result, discontinuity in the pattern of microstrip lines is eliminated in the microstrip lines 112, 113, and 114. This can reduce unnecessary emission from the microstrip lines due to this discontinuity in the pattern.

Next, a first comparative example of the first embodiment is described.

Figure 9:
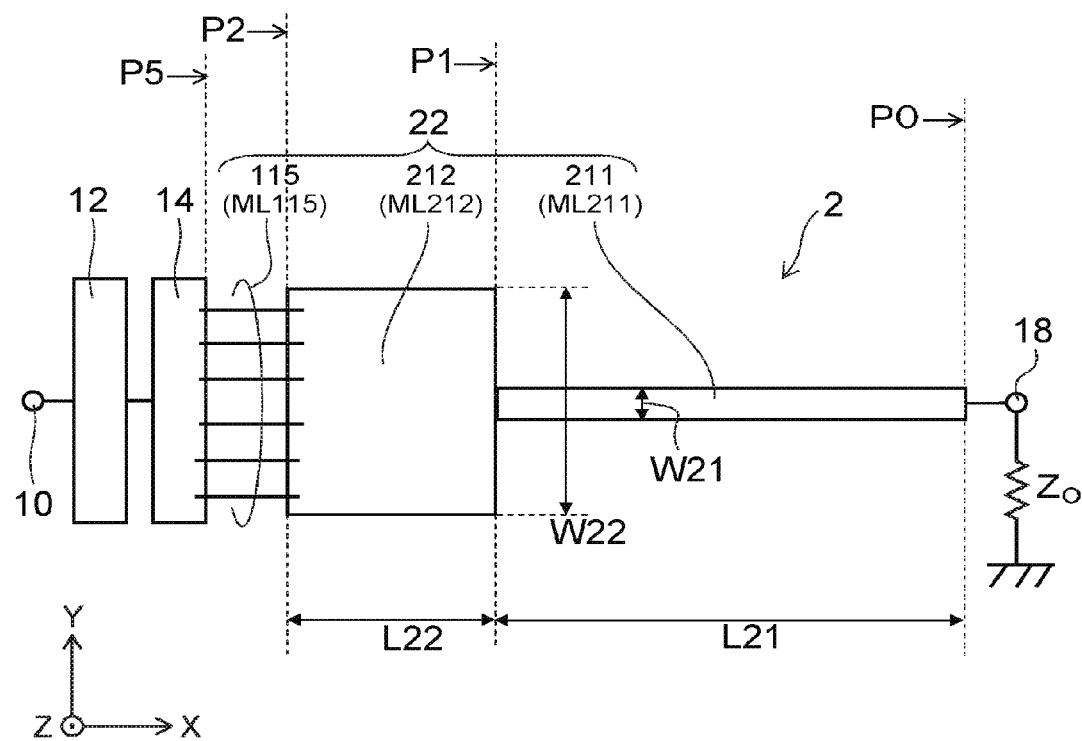
FIG. 9 is a schematic view showing the configuration of a high-frequency semiconductor amplifier according to a first comparative example of the first embodiment.

FIG. 9 is a schematic view showing the configuration of a high-frequency semiconductor amplifier according to this comparative example.

Figure 10:
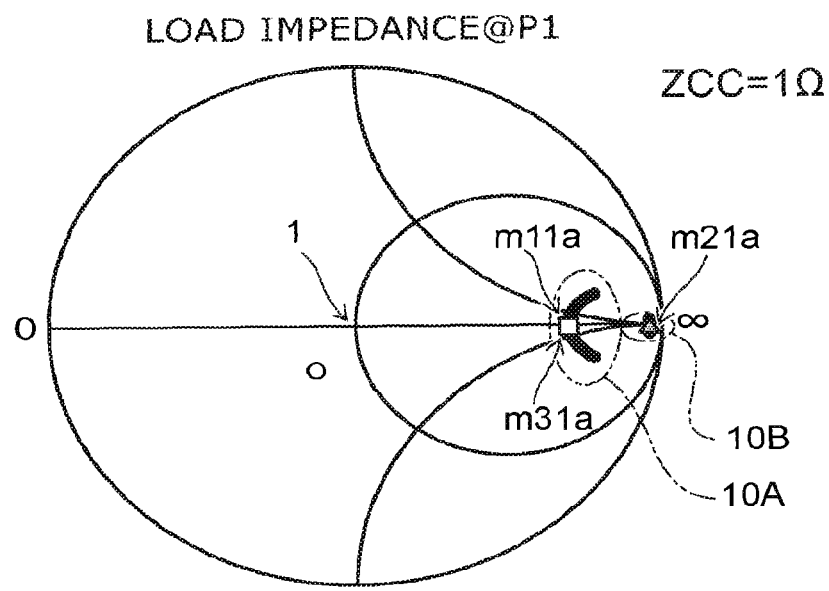
FIG. 10 is an impedance chart illustrating a load impedance seen from a reference plane P1 shown in FIG. 9.

FIG. 10 is an impedance chart illustrating the load impedance seen from the reference plane P1 shown in FIG. 9.

Figure 11:
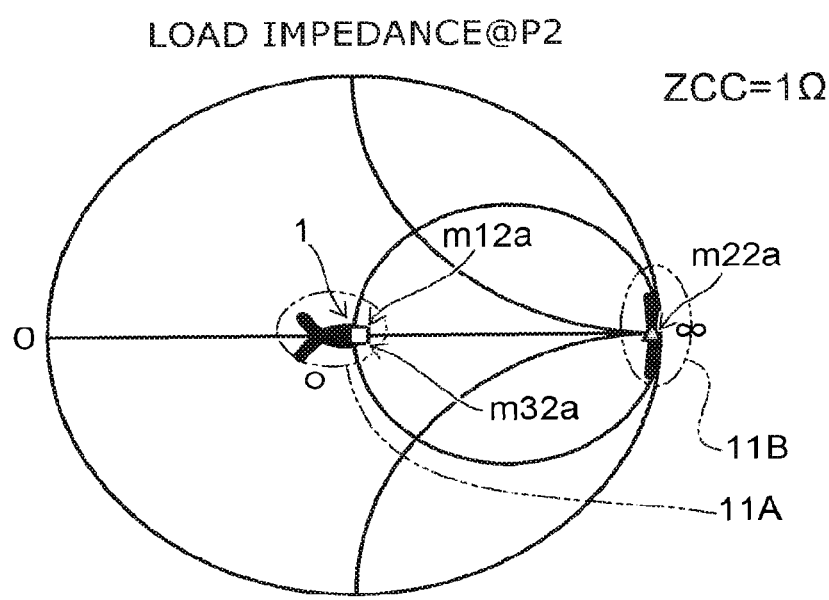
FIG. 11 is an impedance chart illustrating a load impedance seen from a reference plane P2 shown in FIG. 9.

FIG. 11 is an impedance chart illustrating the load impedance seen from the reference plane P2 shown in FIG. 9.

Figure 12:
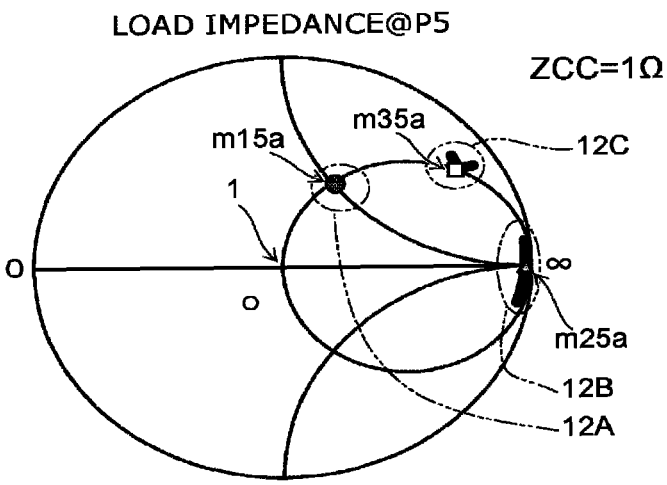
FIG. 12 is an impedance chart illustrating a load impedance seen from a reference plane P5 shown in FIG. 9.

FIG. 12 is an impedance chart illustrating the load impedance seen from the reference plane P5 shown in FIG. 9.

The impedance charts of FIGS. 10 to 12 are normalized so that the center point O represents $1\Omega$ (ZCC=$1\Omega$).

TABLE 2 is a table illustrating the electrical characteristics and dimensions of the microstrip lines in the first comparative example according to this embodiment.

TABLE 2

|  | ML211 | ML212 |
|---|---|---|
| Zc21, 22(Ω) | 18.80 | 2.66 |
| EL21, 22(°) | 90.0 | 90.0 |
| ϵr21, 22 | 10 | 40 |
| t21, 22(μm) | 150 | 250 |
| W21, 22(mm) | 0.680 | 5.060 |
| L21, 22(mm) | 8.830 | 4.140 |

As shown in FIG. 9, the output matching circuit 22 in this comparative example is formed from a microstrip line 211 (ML211), a microstrip line 212 (ML212), and a wire part 115. The position of the reference plane P0 is similar to the position in the above first embodiment. Thus, when the output terminal 18 side is viewed from the reference plane P0, the load impedance m10 at the fundamental frequency f1 is similar to that of the above first embodiment (see FIG. 2). The load impedance m20 at the second harmonic frequency f2 is also similar to that of the above first embodiment (see FIG. 2). The load impedance m30 at the third harmonic frequency f3 is also similar to that of the above first embodiment (see FIG. 2).

The characteristic impedance Zc21 of the microstrip line 211 is 18.8Ω. The electrical length EL21 at the fundamental frequency f1 is 90 degrees. The relative permittivity ϵr21 is 10. The substrate thickness t21 is 150 μm. The line width W21 is 0.68 mm. The line length L21 is 8.83 mm. The characteristic impedance Zc22 of the microstrip line 212 is 2.66Ω. The electrical length EL22 at the fundamental frequency f1 is 90 degrees. The relative permittivity ϵr22 is 40. The substrate thickness t22 is 250 μm. The line width W22 is 5.06 mm. The line length L22 is 4.14 mm.

As shown in FIG. 10, when the output terminal 18 side is viewed from the reference plane P1, the load impedance m11a at the fundamental frequency f1 and the load impedance m31a at the third harmonic frequency f3 are transformed to a portion 10A having an impedance higher than 1Ω and lower than 50Ω. The load impedance m21a at the second harmonic frequency f2 remains near 50Ω. This portion near 50Ω is indicated as portion 10B in FIG. 10.

As shown in FIG. 11, when the output terminal 18 side is viewed from the reference plane P2, the load impedance m12a at the fundamental frequency f1 and the load impedance m32a at the third harmonic frequency f3 are transformed to a portion 11A having an impedance of approximately 1Ω. The load impedance m22a at the second harmonic frequency f2 remains near 50Ω. This portion near 50Ω is indicated as portion 11B in FIG. 11.

As shown in FIG. 12, when the output terminal 18 side is viewed from the reference plane P5, the load impedance m15a at the fundamental frequency f1 is transformed to a portion 12A near (1+j1)Ω because of the added inductivity of the wire part 115. The load impedance m25a at the second harmonic frequency f2 is transformed to a portion 12B near ∞Ω. The load impedance m35a at the third harmonic frequency f3 is transformed to a portion 12C. The load impedance m25a at the second harmonic frequency f2 is set to approximately ∞Ω, but the load impedance m35a at the third harmonic frequency f3 is not set to approximately 0Ω. Thus, it is difficult to cause the high-frequency semiconductor amplifier 2 to perform the inverse class-F operation.

Next, a second comparative example of the first embodiment is described.

Figure 13:
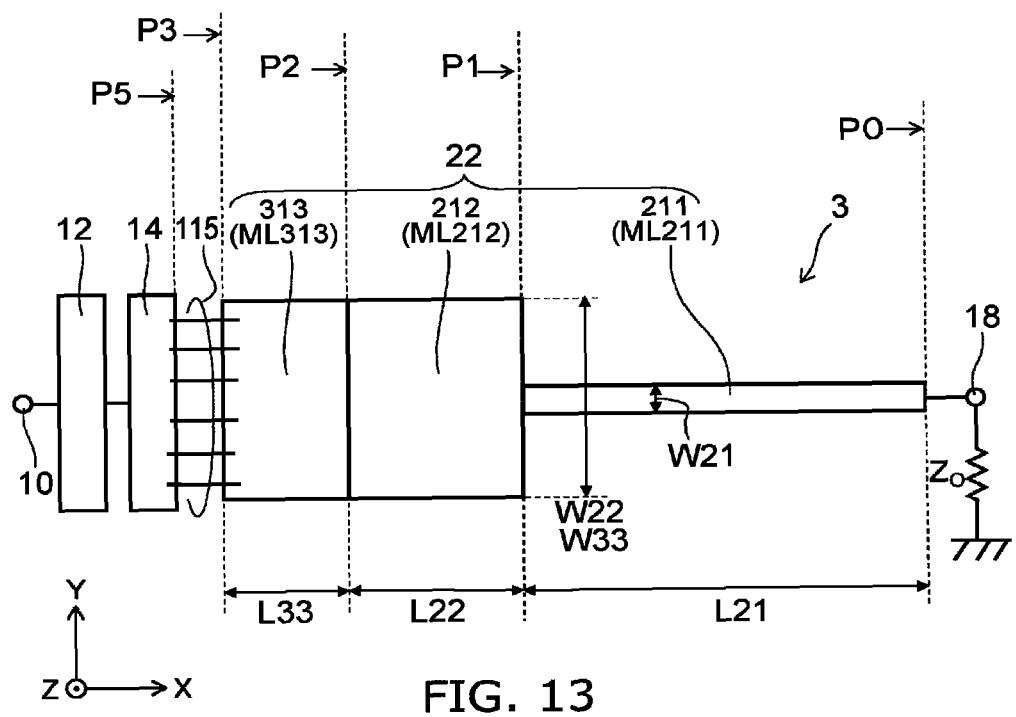
FIG. 13 is a schematic view showing the configuration of a high-frequency semiconductor amplifier according to a second comparative example of the first embodiment.

FIG. 13 is a schematic view showing the configuration of a high-frequency semiconductor amplifier according to the second comparative example of the first embodiment.

Figure 14:
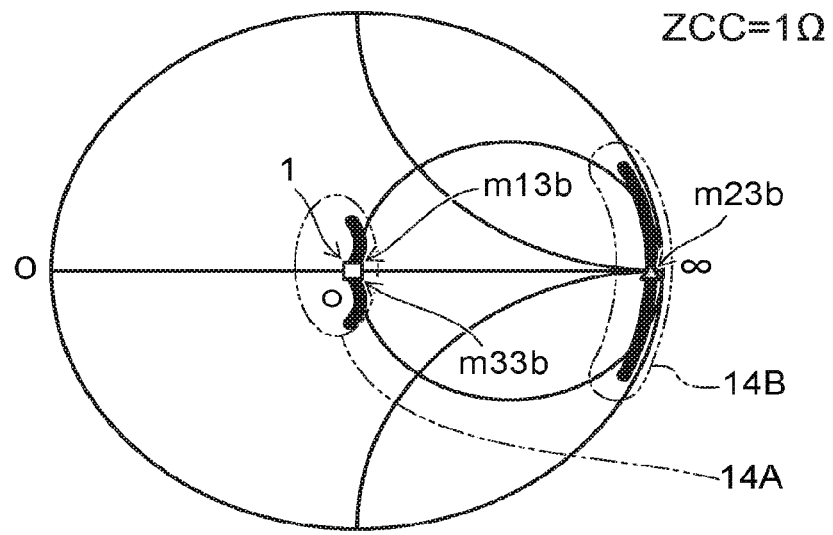
FIG. 14 is an impedance chart illustrating a load impedance seen from a reference plane P3 shown in FIG. 13.

FIG. 14 is an impedance chart illustrating the load impedance seen from the reference plane P3 shown in FIG. 13.

Figure 15:
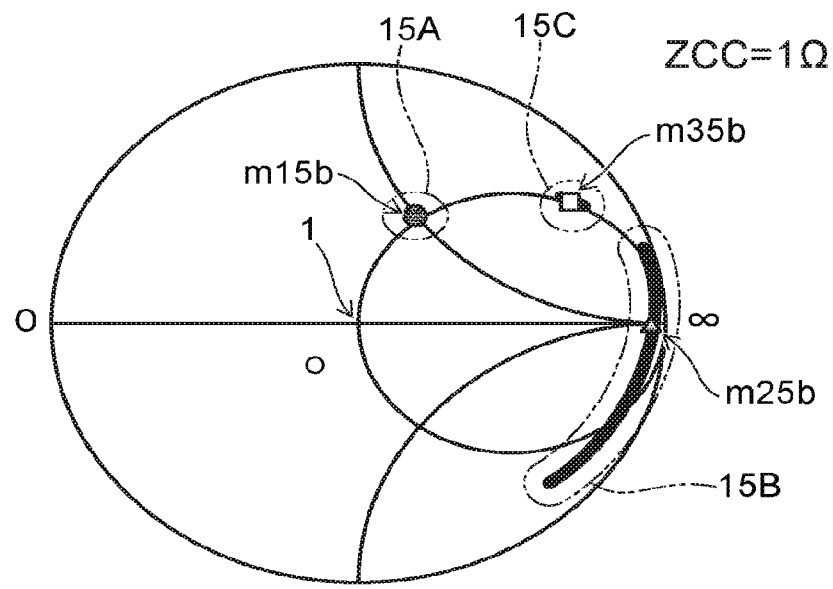
FIG. 15 is an impedance chart illustrating a load impedance seen from a reference plane P5 shown in FIG. 13.

FIG. 15 is an impedance chart illustrating the load impedance seen from the reference plane P5 shown in FIG. 13.

The impedance charts of FIGS. 14 and 15 are normalized so that the center point O represents 1Ω (ZCC=1Ω).

TABLE 3 is a table illustrating the electrical characteristics and dimensions of the microstrip lines in the second comparative example according to this embodiment.

TABLE 3

|  | ML211 | ML212 | ML313 |
|---|---|---|---|
| Zc21, 22, 33(Ω) | 18.80 | 2.66 | 1.00 |
| EL21, 22, 33(°) | 90.0 | 90.0 | 90.0 |
| ϵr21, 22, 33 | 10 | 40 | 90 |
| t21, 22, 33(μm) | 150 | 250 | 135 |
| W21, 22, 33(mm) | 0.680 | 5.060 | 5.050 |
| L21, 22, 33(mm) | 8.830 | 4.140 | 2.710 |

As shown in FIG. 13, the output matching circuit 23 in the second comparative example of this embodiment is different from the output matching circuit 22 in the above first comparative example in that the microstrip line 313 (ML313) is provided between the microstrip line 212 and the wire part 115. Thus, when the output terminal 18 side is viewed from the reference planes P0, P1, and P2, the load impedances m10, m11, and m12 at the fundamental frequency f1 are similar to those of the above first comparative example. When the output terminal 18 side is viewed from the reference planes P0, P1, and P2, the load impedances m20, m21, and m22 at the second harmonic frequency f2 are similar to those of the above first comparative example. When the output terminal 18 side is viewed from the reference planes P0, P1, and P2, the load impedances m30, m31, and m32 at the third harmonic frequency f3 are similar to those of the above first comparative example. The characteristic impedance Zc33 of the microstrip line 313 is 1.0Ω. The electrical length EL33 at the fundamental frequency f1 is 90 degrees. The relative permittivity ϵr33 is 90. The substrate thickness t33 is 135 μm. The line width W33 is 5.05 mm. The line length L33 is 2.71 mm.

As shown in FIG. 14, when the output terminal 18 side is viewed from the reference plane P3, the load impedance m13b at the fundamental frequency f1 remains near 1Ω as in the case viewed from the reference plane P2. The load impedance m33b at the third harmonic frequency f3 also remains near 1Ω. This portion near 1Ω is indicated as portion 14A. In the case where the load impedance is located in the portion 14A, the phase can be adjusted by adding e.g. a strip line or wire. The load impedance m23b at the second harmonic frequency f2 is transformed to a portion 14B near ∞Ω. In the case where the load impedance is located near ∞Ω, the impedance is not substantially changed even if the phase is adjusted by adding e.g. a strip line.

As shown in FIG. 15, when the output terminal 18 side is viewed from the reference plane P5, the load impedance m15b at the fundamental frequency f1 is transformed to a portion 15A near (1+j1)Ω because of the added inductivity of the wire part 115. The load impedance m25b at the second harmonic frequency f2 remains near ∞Ω without substantial change. This portion near ∞Ω is indicated as portion 15B in FIG. 15.

The load impedance m35b at the third harmonic frequency f3 is transformed to a portion 15C because of the added inductivity of the wire part 115. As in the first comparative example, the load impedance m35b at the third harmonic frequency f3 is not set to approximately 0Ω. Thus, it is difficult to cause the high-frequency semiconductor amplifier 3 to perform the inverse class-F operation.

Next, a third comparative example of the first embodiment is described.

Figure 16A:
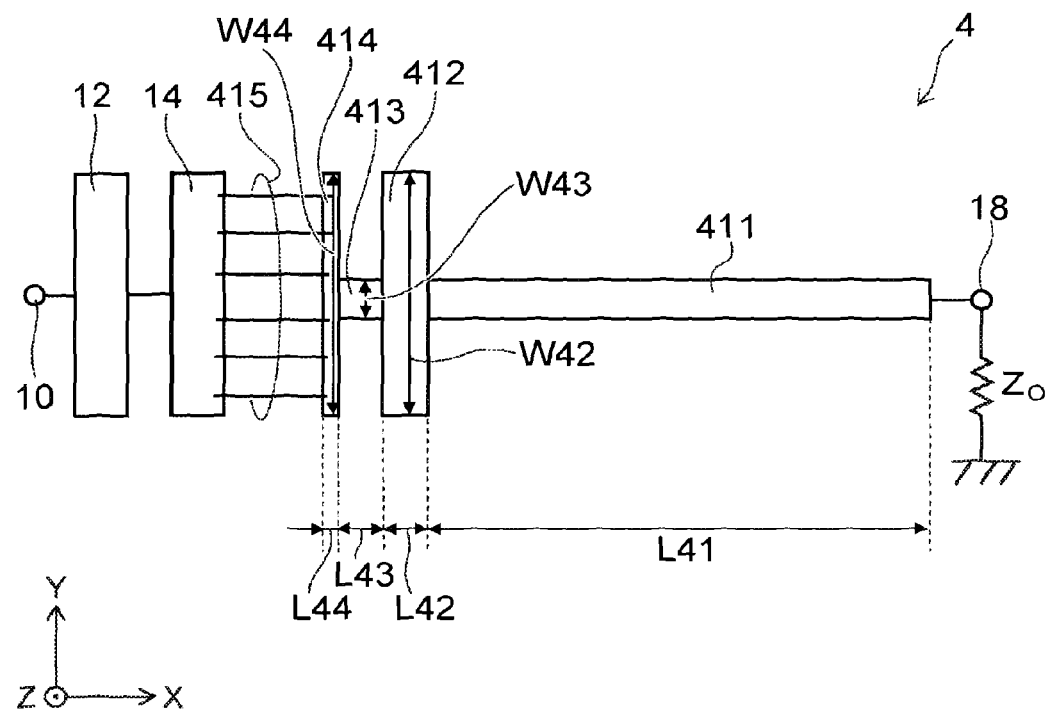
FIGS. 16A and 16B are schematic views showing the configuration of a high-frequency semiconductor amplifier according to a third comparative example of the first embodiment.
Figure 16B:
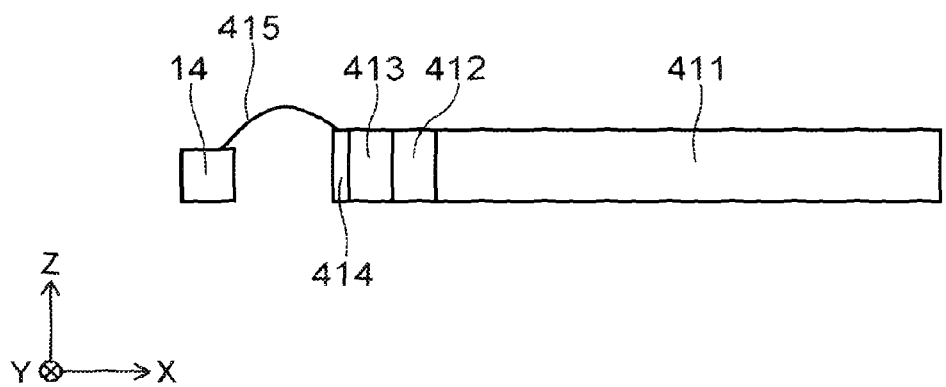

FIGS. 16A and 16B are schematic views showing the configuration of a high-frequency semiconductor amplifier according to the third comparative example of the first embodiment.

TABLE 4 is a table illustrating the electrical characteristics and dimensions of the microstrip lines in the third comparative example according to this embodiment.

TABLE 4

|  | ML411 | ML412 | ML413 | ML414 |
|---|---|---|---|---|
| Zc41~44(Ω) | 15.90 | 1.13 | 4.67 | 1.00 |
| EL41~44(°) | 96.0 | 26.0 | 24.0 | 7.0 |
| εr41~44 | 10 | 90 | 90 | 90 |
| t41~44(μm) | 150 | 135 | 135 | 135 |
| W41~44(mm) | 0.846 | 4.440 | 0.903 | 5.052 |
| L41~44(mm) | 9.310 | 0.790 | 0.780 | 0.210 |

As shown in TABLE 4, in the high-frequency semiconductor amplifier 4 according to this comparative example, the microstrip line 412 (ML412), the microstrip line 413 (ML413), and the microstrip line 414 (ML414) are formed on a substrate having the same permittivity and the same thickness. Then, as shown in FIG. 16A, the line width W43 of the microstrip line 413 is smaller than the line width W42 of the microstrip line 412. The line width W43 of the microstrip line 413 is smaller than the line width W44 of the microstrip line 414. The line width of the microstrip line 412, the microstrip line 413, and the microstrip line 414 is not constant, but a depression occurs. Thus, unnecessary radio waves are emitted from the microstrip line 412, the microstrip line 413, and the microstrip line 414.

The embodiment described above can provide a high-frequency semiconductor amplifier for amplifying high-frequency signals at high power-added efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimrf is:

1. A high-frequency semiconductor amplifier comprising:
   an input terminal inputted with a fundamental signal having a first frequency band and a first center frequency in the first frequency band;
   an input matching circuit including an input end and an output end, the input end of the input matching circuit being connected to the input terminal;
   a high-frequency semiconductor amplifying element including an input end and an output end, the input end of the high-frequency semiconductor amplifying element being connected to the output end of the input matching circuit, and the high-frequency semiconductor amplifying element being configured to amplify the fundamental signal;
   an output matching circuit including an input end and an output end, the input end of the output matching circuit being connected to the output end of the high-frequency semiconductor amplifying element; and
   an output terminal connected to the output end of the output matching circuit,
   the output matching circuit including:
      a first transmission line including an input end and an output end, the output end of the first transmission line being connected to the output end of the output matching circuit, the first transmission line having an electrical length of 72 degrees or more and 108 degrees or less at the first center frequency, and a characteristic impedance of the first transmission line being lower than 50Ω, which is a load impedance of an external load connected to the output terminal;
      a second transmission line including an input end and an output end, the output end of the second transmission line being connected to the input end of the first transmission line, the second transmission line having an electrical length of 18 degrees or more and 27 degrees or less at the first center frequency, and a characteristic impedance of the second transmission line being lower than the characteristic impedance of the first transmission line;
      a third transmission line including an input end and an output end, the output end of the third transmission line being connected to the input end of the second transmission line, the third transmission line having an electrical length of 18 degrees or more and 27 degrees or less at the first center frequency, a characteristic impedance of the third transmission line being lower than the characteristic impedance of the first transmission line and higher than the characteristic impedance of the second transmission line and a resistance of a desired load impedance provided to the high-frequency semiconductor amplifying element for fundamental frequency, and a line width along a second direction of the third transmission line being 0.8 times or more and 1.2 times or less of a line width along the second direction of the second transmission line;
      a fourth transmission line including an input end and an output end, the output end of the fourth transmission line being connected to the input end of the third transmission line, the fourth transmission line having an electrical length of 5 degrees or more and 10 degrees or less at the first center frequency, and a characteristic impedance of the fourth transmission line being equal to the resistance of the desired load impedance provided to the high-frequency semiconductor amplifying element for fundamental frequency; and
      a wire part including an input end and an output end, the output end of the wire part being connected to the input end of the fourth transmission line, and the input end of the wire part being connected to the input end of the output matching circuit.

2. The amplifier according to claim 1, wherein a relative permittivity of a substrate of the second transmission line is 1.6 times or more and 2.4 times or less of a relative permittivity of a substrate of the fourth transmission line.

3. The amplifier according to claim 2, wherein a substrate thickness along a third direction crossing the second direction of the second transmission line is 1.3 times or more and 1.9 times or less of a substrate thickness along the third direction of the fourth transmission line.

4. The amplifier according to claim 1, wherein a relative permittivity of a substrate of the third transmission line is 0.08 times or more and 0.12 times or less of a relative permittivity of a substrate of the fourth transmission line.

5. The amplifier according to claim 1, wherein the characteristic impedance of the second transmission line is higher than the characteristic impedance of the fourth transmission line.

6. The amplifier according to claim 1, wherein the line width along the second direction of the third transmission line is 0.8 times or more and 1.2 times or less of a line width along the second direction of the fourth transmission line.

7. The amplifier according to claim 1, wherein
a relative permittivity of a substrate of the second transmission line is 1.6 times or more and 2.4 times or less of a relative permittivity of a substrate of the fourth transmission line, and
a relative permittivity of a substrate of the third transmission line is 0.08 times or more and 0.12 times or less of the relative permittivity of the substrate of the fourth transmission line.

8. The amplifier according to claim 1, wherein a relative permittivity of a substrate of the fourth transmission line is higher than relative permittivity of a substrate of the first transmission line.

9. The amplifier according to claim 1, wherein the line width along the second direction of the second transmission line is 0.8 times or more and 1.2 times or less of a line width along the second direction of the fourth transmission line.

10. The amplifier according to claim 1, wherein the characteristic impedance of the third transmission line is higher than the characteristic impedance of the second transmission line.

* * * * *